(12) United States Patent
Li et al.

(10) Patent No.: US 7,936,220 B2
(45) Date of Patent: May 3, 2011

(54) TECHNIQUES FOR IMPROVING AMPLIFIER LINEARITY

(75) Inventors: Xiaoyong Li, Santa Clara, CA (US); Sang-Oh Lee, Cupertino, CA (US); Cormac S. Conroy, Campbell, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 90 days.

(21) Appl. No.: 12/334,306

(22) Filed: Dec. 12, 2008

(65) Prior Publication Data

US 2010/0148873 A1 Jun. 17, 2010

(51) Int. Cl.
 *H03F 3/04* (2006.01)
(52) U.S. Cl. .......................................... 330/311; 330/149
(58) Field of Classification Search .................. 330/149, 330/311; 375/296–297; 455/114.3
See application file for complete search history.

(56) References Cited

U.S. PATENT DOCUMENTS

| 7,656,229 B2 * | 2/2010 | Deng et al. ..................... 330/149 |
| 7,696,828 B2 * | 4/2010 | Chang ............................ 330/311 |
| 2007/0030076 A1 * | 2/2007 | Kim et al. ....................... 330/311 |
| 2007/0229154 A1 | 10/2007 | Kim et al. |

FOREIGN PATENT DOCUMENTS

EP 1524763 A1 4/2005

OTHER PUBLICATIONS

Guochi Huang et al: "Post Linearization of CMOS LNA Using Double Cascode Fets" Circuits and Systems, 2006. ISCAS 2006. Proceedings. 2006 IEEE International Symposium on, IEEE, Piscataway, NJ, USA, (May 21, 2006), pp. 4499-4502, XP010939693.
International Search Report/Written Opinion—PCT/US09/067771—International Search Authority EPO—May 3, 2010.
Kim, et al: "A Cellular-Band CDMA 0.25-1M CMOS LNA Linearized Using Active Post-Distortion," IEEE Journal of Solid-State Circuits, vol. 41, No. 7, Jul. 1, 2006, pp. 1530-1534, ISSN: 0018-9200 (p. 1530 line 15-p. 1533 line 7).
Mujeeb A., et al., "Highly linear CMOS low noise amplifier with IIP3 boosting technique, Soc Design Conference, 2008 ISOCC" "08 International, IEEE, Piscataway, NJ, USA, Nov. 24, 2008, pp. 1-414, XP031449530 ISBN: 978-1-4244-2598-3 p. 414, right-hand column, line 4—p. 416, right-hand column, line 8; figures 1,2,".
Park, et al: "Consideration of Linearity in Cascode Low Noise Amplifiers Using Double Derivative Superposition Method With a Tuned Inductor," Microwave Conference, 2007, KJMW 2007, Korea-Japan, pp. 21-24, ISBN: 978-1-4244-1556-4 (p. 21 Line 18-p. 24, Line 12).
Aparin et al: "Modified derivative superposition method for linearizing FET low-noise amplifiers," Microwave Theory and Techniques, IEEE Transactions on; vol. 53 , Issue: 2; Digital Object Identifier: 10.1109/TMTT.2004.840635; Publication Year: 2005 , PP. 571-581.

* cited by examiner

*Primary Examiner* — Hieu P Nguyen
(74) *Attorney, Agent, or Firm* — Ramin Mobarhan

(57) ABSTRACT

Techniques for improving the linearity of a cascode amplifier. In an exemplary embodiment, an auxiliary common-gate amplifier is provided in parallel with the principal cascode branch. The auxiliary common-gate amplifier samples a cascoded node in the principal cascode branch. The auxiliary common-gate amplifier generates a current which, when combined with the current generated by the principal cascode branch, cancels a distortion component to generate an output current with improved linearity characteristics. In an exemplary embodiment, a phase shifting network couples the cascoded node to the auxiliary common-gate amplifier, and may include, e.g., a capacitor coupled to an inductor.

15 Claims, 6 Drawing Sheets

TECHNIQUES FOR IMPROVING AMPLIFIER LINEARITY

TECHNICAL FIELD

The disclosure relates to integrated circuit (IC) design, and more particularly, to techniques for improving the linearity of IC amplifiers employing a cascode configuration.

BACKGROUND

An amplifier is designed to provide gain to an input signal to generate an amplified output signal. In integrated circuits, one common amplifier design employs transistors coupled in a cascode configuration. A cascode amplifier provides gain to the input signal usually over a specific linear operating range. If the magnitude of the input signal falls outside the linear operating range, then undesirable non-linear components such as third-order inter-modulation distortion (IMD3) components may arise in the amplifier output.

One way to reduce the level of IMD3 in the cascode amplifier output is to provide an auxiliary signal path coupled in parallel with the principal cascode signal path. The auxiliary path may be designed to generate an auxiliary current to cancel the IMD3 components in the output current when combined with the principal cascode current. See, e.g., Kim, Namsoo, et al., "A Cellular-Band CDMA 0.25-um CMOS LNA Linearized Using Active Post-Distortion," IEEE Journal of Solid-State Circuits, Vol. 41, No. 7, July 2006.

One limitation of techniques utilizing such an auxiliary path is that the signal gain of the cascode amplifier may be significantly reduced along with the IMD3 components. It would be desirable to provide techniques to reduce the IMD3 components in the output signal of a cascode amplifier without significantly reducing the amplifier signal gain.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
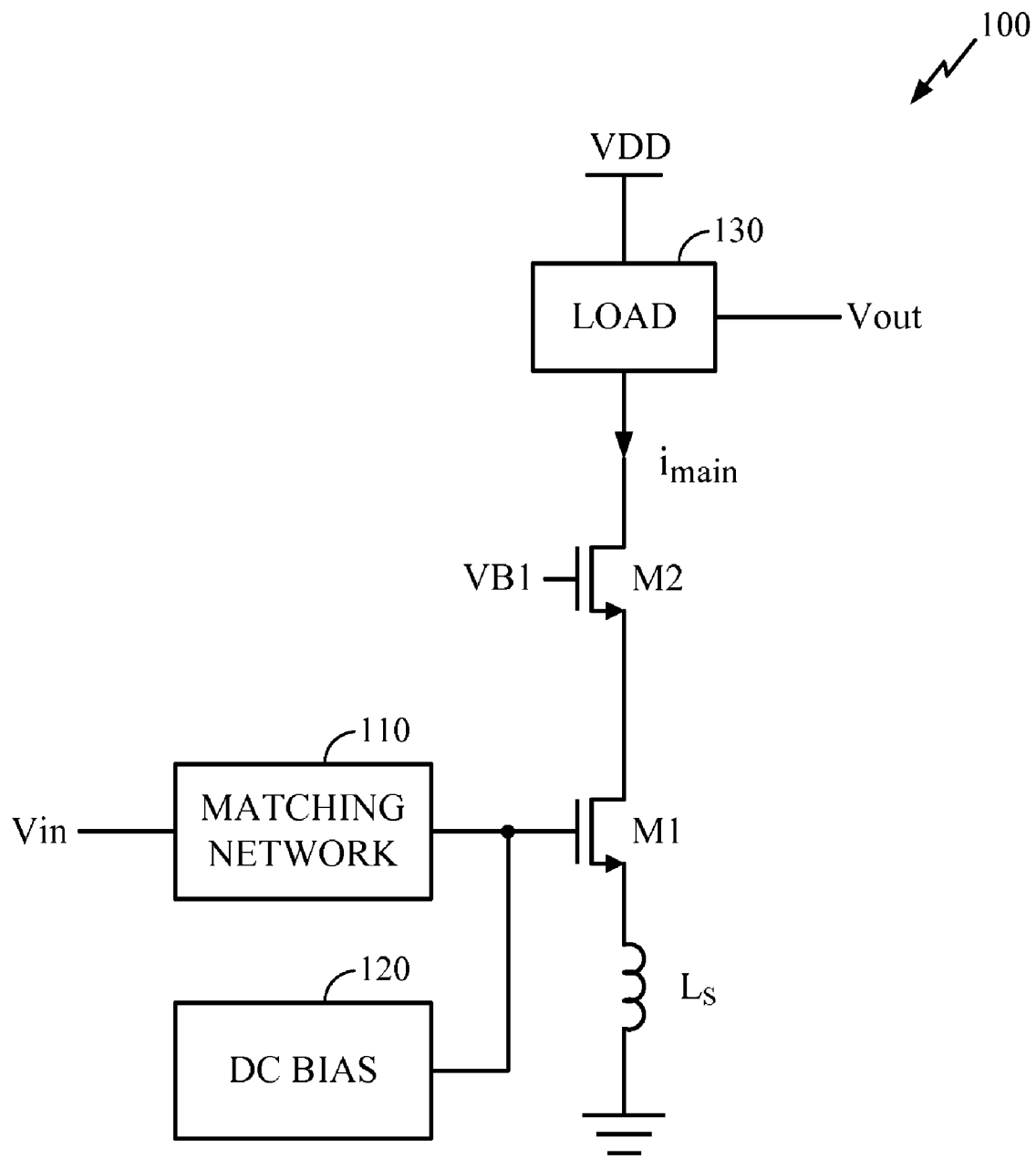
FIG. 1 depicts a prior art implementation of a cascode amplifier.

FIG. 1 depicts a prior art implementation of a cascode amplifier 100. The amplifier 100 may be employed as, e.g., a low-noise amplifier (LNA) for a communications receiver, although the techniques of the present disclosure need not be limited to the design of LNA's.

In FIG. 1, an input voltage Vin is supplied to the gate of transistor M1 via a matching network 110, with DC bias circuit 120 biasing the gate of transistor M1. The drain of M1 is coupled to the source of transistor M2, whose gate is biased by a voltage VB1. Collectively, transistors M1 and M2 are configured as a cascode amplifier well-known in the art, with an output current i_main of M2 being provided to a load 130 to generate an output voltage Vout. An inductance Ls is further coupled to the source of transistor M1 to provide source degeneration for the amplifier.

One of ordinary skill in the art will appreciate that one factor limiting the performance of the cascode amplifier 100 is the presence of third-order inter-modulation distortion (IMD3 ) components arising in the output voltage Vout when Vin is sufficiently large. Such IMD3 may be due, e.g., to the non-linear transconductance of transistor M1 in the presence of large gate voltages. Left unabated, the IMD3 distorts the amplified version of the input signal, and may significantly degrade the linearity of the receiver.

Figure 2:
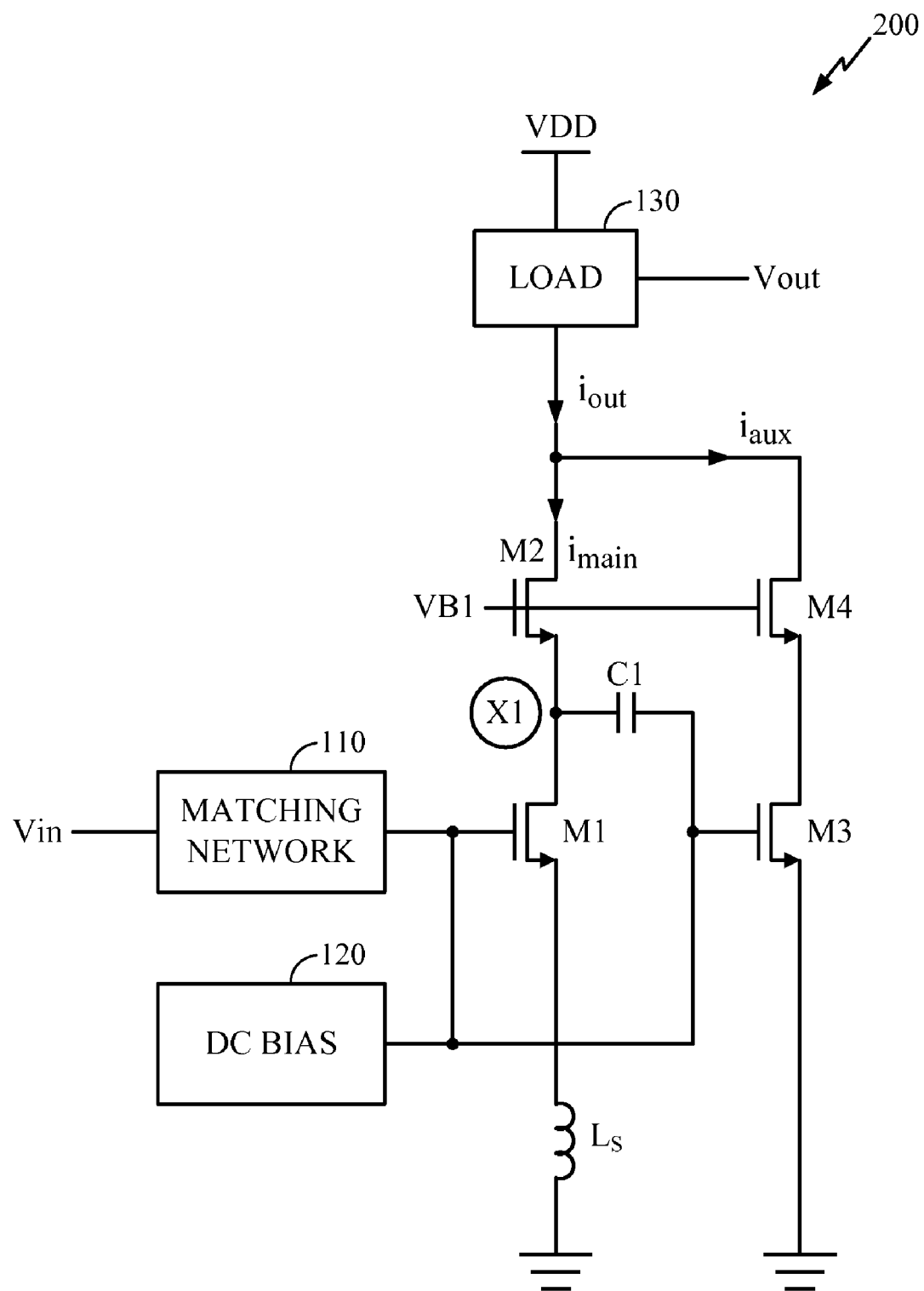
FIG. 2 depicts a prior art implementation of a cascode amplifier employing IMD3 cancellation.

FIG. 2 depicts a prior art implementation of a cascode amplifier 200 employing IMD3 cancellation. In FIG. 2, transistors M1 and M2 form a principal cascode branch, and are configured and biased similarly to the corresponding transistors in the amplifier 100 of FIG. 1. The signal at node X1, or the "cascoded node," is coupled to the gate of transistor M3 through coupling capacitor C1. Transistors M3 and M4 form an auxiliary cascode branch, generating a current i_aux in response to the signal sampled from node X1. The signal current i_aux of the auxiliary cascode branch combines with the signal current i_main of the principal cascode branch to generate the total output current i_out for the amplifier 200, again producing an output voltage Vout at the load 130.

One of ordinary skill in the art will appreciate that by selecting the relative transconductances amongst the transistors M1, M2, M3, M4 of amplifier 200, the relationship between i_main and i_aux may be chosen such that the IMD3 present in the output voltage Vout may be significantly reduced, while reducing some portion of the signal gain Vout/Vin. See, e.g., Kim, et al., earlier referenced herein.

While the amplifier 200 may be designed to have better linearity characteristics than the amplifier 100, one of ordinary skill in the art will appreciate that the effectiveness of the IMD3 cancellation in amplifier 200 is nevertheless limited by the fact that some amount of the desired amplified signal component must be cancelled along with the IMD3 , which undesirably reduces the amplifier gain. In particular, assume, e.g., that the input voltage Vin is increased (i.e., becomes more positive), which increases the current i_main flowing through the principal cascode branch formed by M1 and M2. The voltage at node X1 is correspondingly decreased (i.e., becomes more negative), due to the inverting nature of the common-source configuration of transistor M1. This decreases the voltage at the gate of transistor M3, which decreases the current i_aux flowing through the cascode formed by M3 and M4. As the output current i_out of the overall amplifier 200 is given by i_out=i_main+i_aux, the increase in i_main due to increasing Vin is seen to be offset by a corresponding decrease in i_aux. Thus for the same configuration and bias of transistors M1 and M2, the signal gain Vout/Vin of amplifier 200 is seen to be less than the signal gain of amplifier 100.

It would be desirable to provide techniques for IMD3 cancellation that do not significantly reduce the signal gain of the cascode amplifier.

Figure 3:
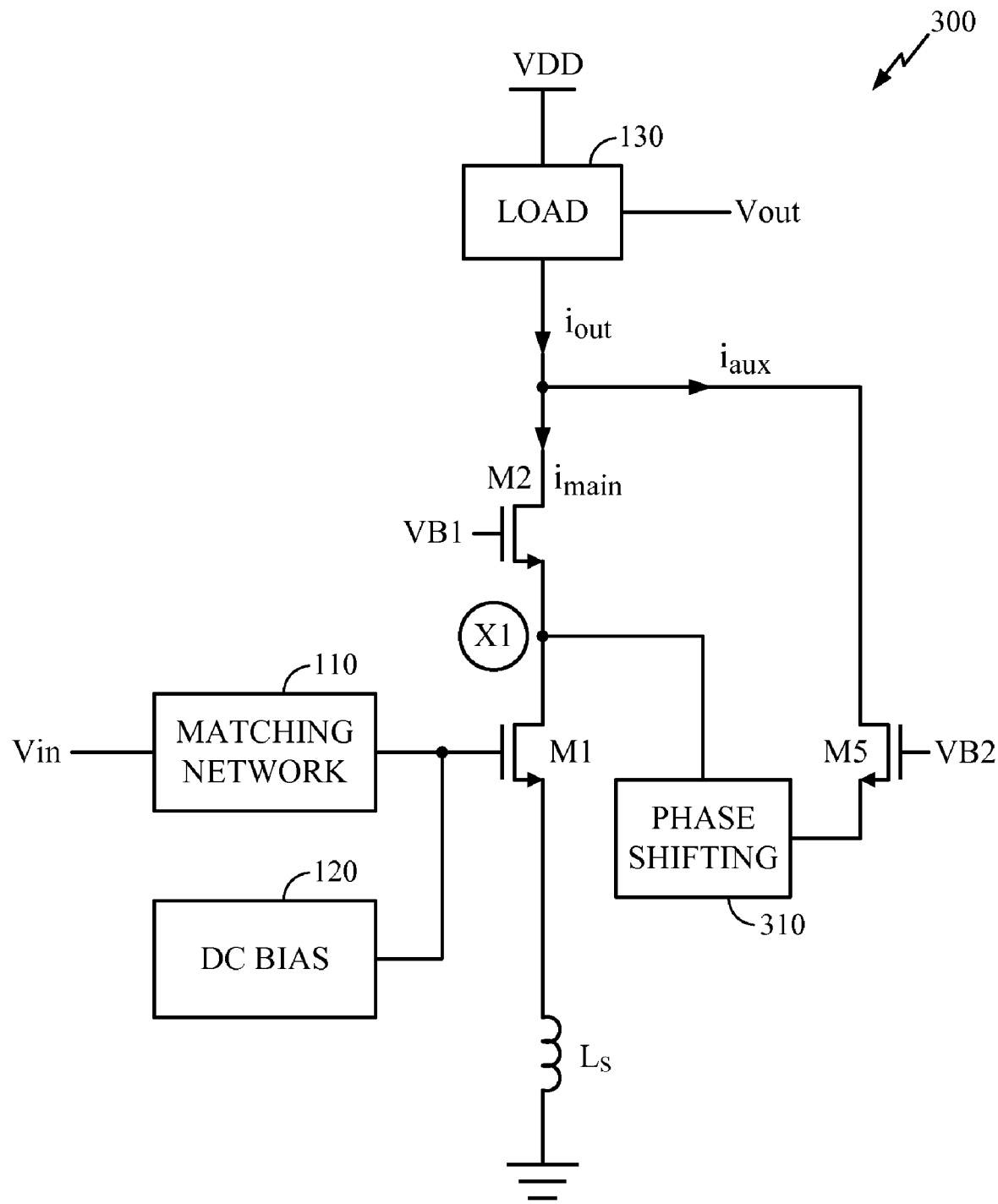
FIG. 3 depicts an exemplary embodiment of an amplifier employing an IMD3 cancellation technique according to the present disclosure.

FIG. 3 depicts an exemplary embodiment of an amplifier 300 employing IMD3 cancellation techniques according to the present disclosure. In FIG. 3, the signal at node X1 is coupled via a phase shifting network to the source of transistor M5, which is configured as a common-gate amplifier. Due to the polarity of the signals in the amplifier 300, IMD3 cancellation may be achieved without significantly decreasing the desired signal gain.

In particular, one of ordinary skill in the art will appreciate that by choosing the bias voltage VB2 and/or the size of the transistor M5 relative to the other transistors, the IMD3 components in the output voltage Vout may be cancelled in a manner analogous to that described for the amplifier 200. On the other hand, to illustrate the behavior of the desired signal, assume once again, e.g., that the signal input voltage Vin is increased. This increases the current i_main flowing through the principal cascode branch formed by M1 and M2, decreasing the voltage at node X1. The voltage at node X1 is coupled to the source of transistor M3 via a (non-inverting) phase shift network 310. As transistor M3 is configured as a common-gate amplifier, the decrease in the source voltage of transistor M3 (due to the voltage decrease at node X1) causes the current i_aux of the auxiliary branch to increase. As the output current i_out of the overall amplifier 300 is given by i_out=i_main+i_aux, the increase in i_main due to increasing Vin is seen to be coupled with an increase in i_aux. Thus the desired signal components in i_main and i_aux are seen to additively combine to increase signal gain, in contrast with the IMD3 cancellation architecture of amplifier 200 in FIG. 2.

One of ordinary skill in the art will appreciate that the phase shift network 310 may be designed such that the desired signal experiences low loss while the IMD3 component (which may be at, e.g., a much higher frequency than the desired signal) is phase-shifted so as to enable sufficient IMD3 cancellation at the amplifier output. For example, the amount of phase shift introduced by phase shift network 310 may be such that the IMD3 component in the output current i_out is minimized by the overall combination of i_main with: 1) a distortion component from the principal cascode branch coupled to the phase shift network 310 and then coupled to the common-gate amplifier M5, plus 2) any distortion arising from the common-gate amplifier M5 itself.

In an exemplary embodiment, the size and biasing of the transistor M5 may be chosen such that the increased power consumption by M5 is insignificant relative to the overall cascode amplifier.

Figure 4:
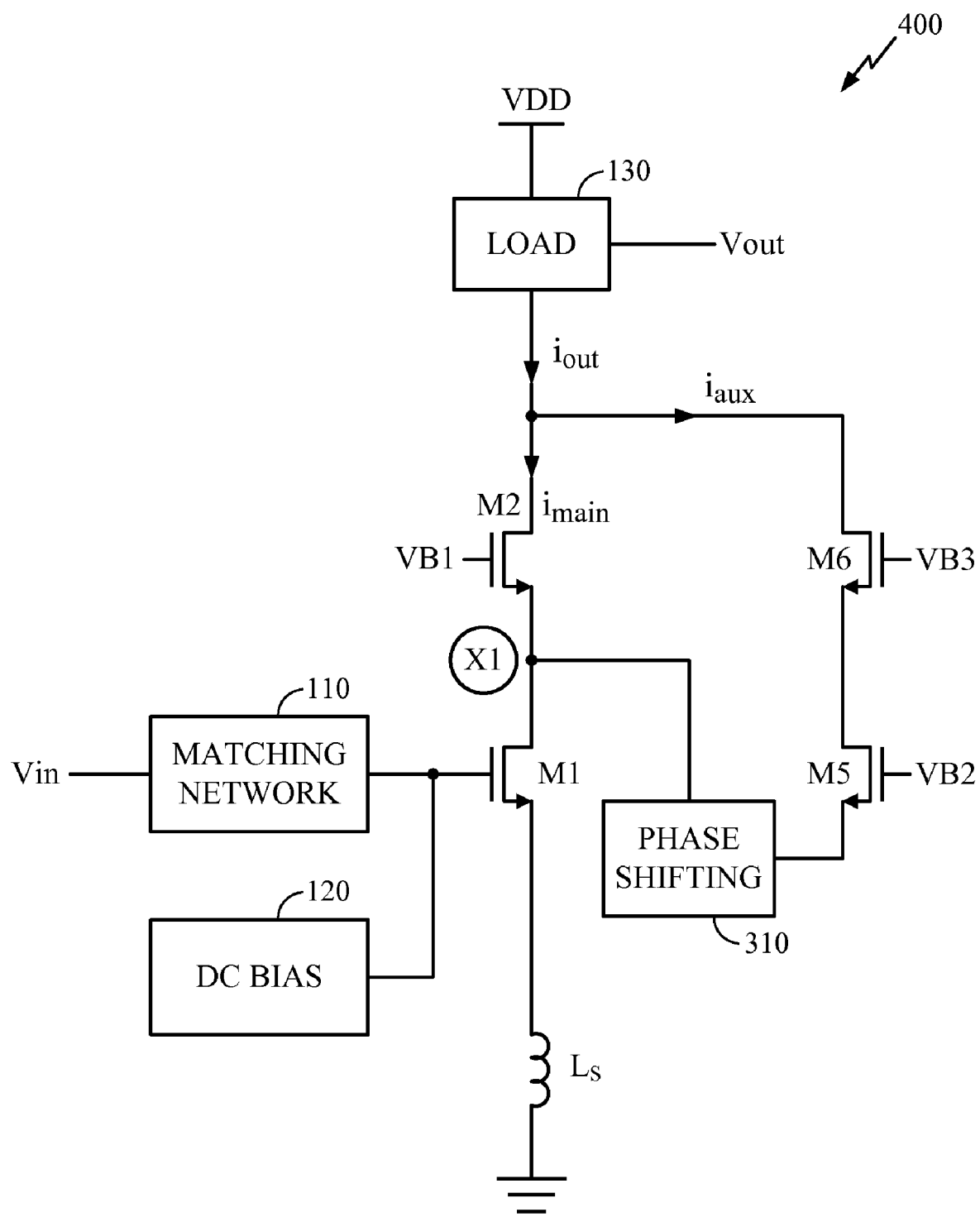
FIG. 4 depicts an alternative exemplary embodiment according to the present disclosure, wherein an additional transistor M6 is provided in the auxiliary branch.

FIG. 4 depicts an alternative exemplary embodiment according to the present disclosure, wherein an additional transistor M6 is provided in the auxiliary branch. One of ordinary skill in the art will appreciate that the bias voltage and/or size of M6 may provide an additional degree of freedom in setting the IMD3 cancellation/gain characteristics of the auxiliary branch.

Figure 5:
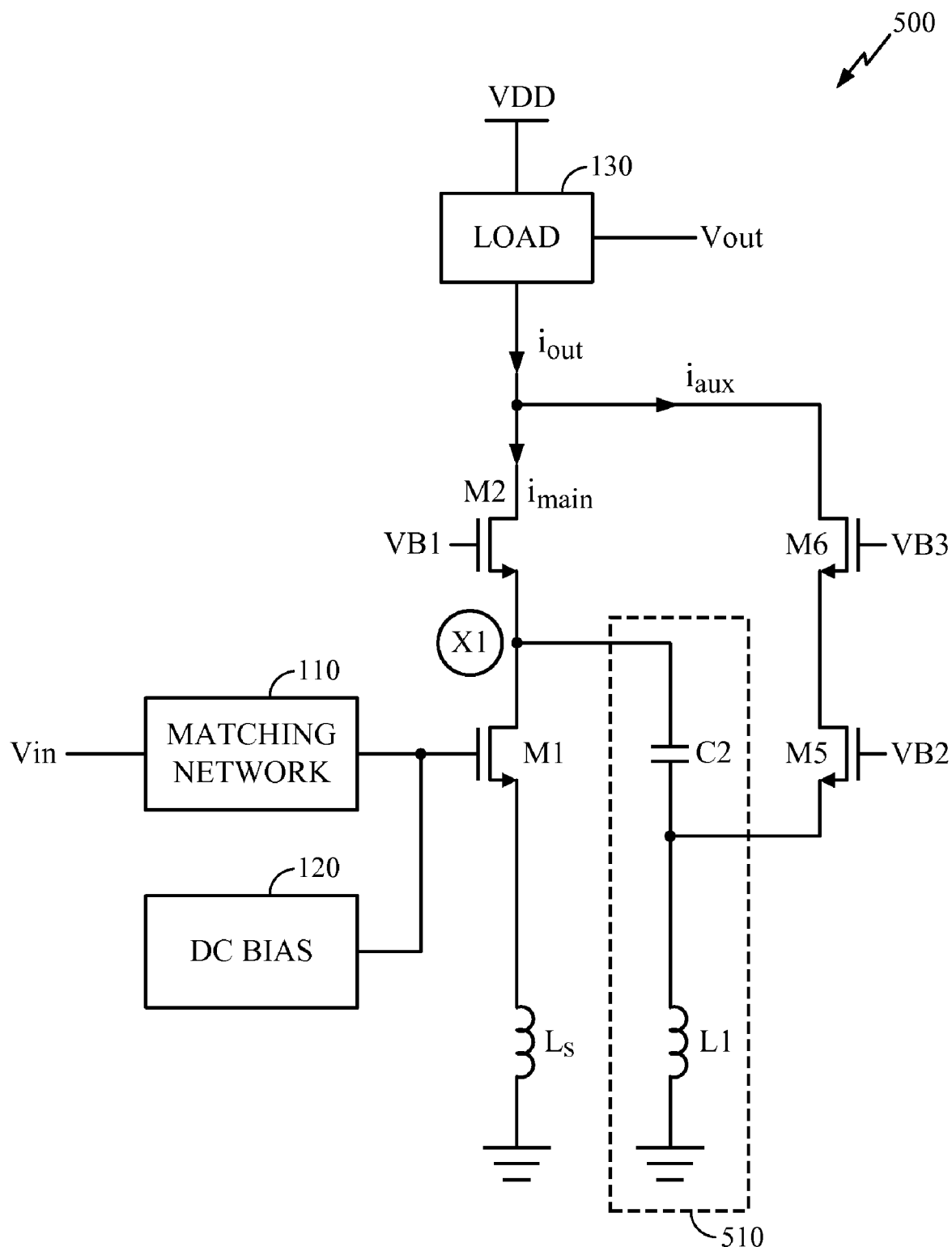
FIG. 5 depicts an exemplary embodiment according to the present disclosure, wherein a specific implementation of a phase shift network is provided.

FIG. 5 depicts an exemplary embodiment according to the present disclosure, wherein a specific implementation of a phase shift network 510 is given. In FIG. 5, a capacitor C2 directly couples the voltage at node X1 to the source of transistor M5, while an inductor L1 couples the source of M5 to ground. One of ordinary skill in the art will appreciate that the values of C2 and L1 may be chosen such that the signal experiences low loss while the IMD3 component (which may be at, e.g., a much higher frequency than the signal) is phase-shifted so as to enable sufficient IMD3 cancellation at the amplifier output. The appropriate values may be obtained, for example, via circuit simulation by sweeping C2 and L1 over a range of candidate values.

Note the exemplary embodiment shown in FIG. 5 is for illustrative purposes only, and is not meant to restrict the scope of the present disclosure to any particular phase shift network implementations shown.

Figure 6:
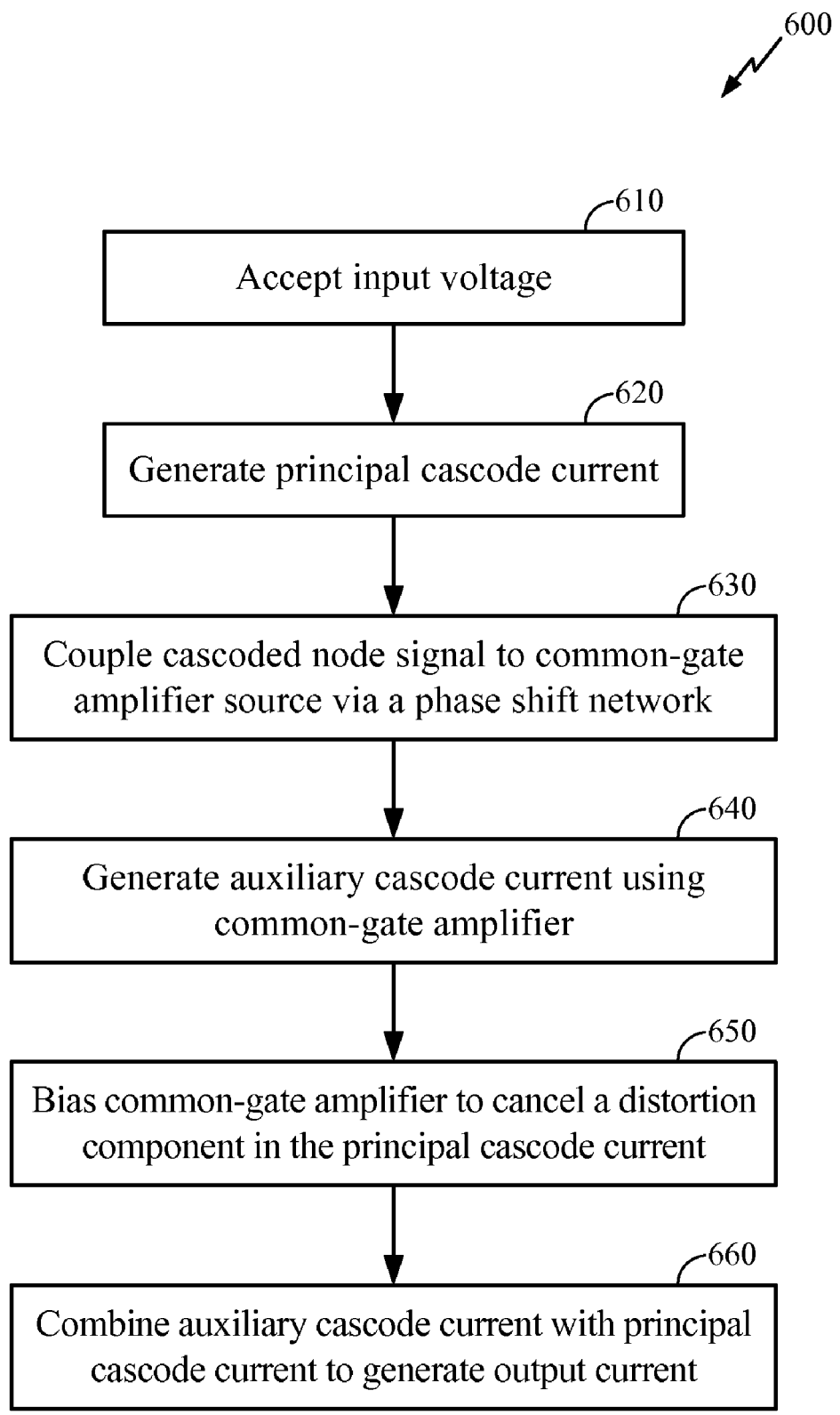
FIG. 6 depicts an exemplary embodiment of a method according to the present disclosure.

FIG. 6 depicts an exemplary embodiment of a method 600 according to the present disclosure. Note the method is shown for illustrative purposes only, and is not meant to limit the scope of the present disclosure to any particular method disclosed.

In block 610, an input voltage is accepted by the cascode amplifier.

In block 620, a principal cascode current is generated based on the input voltage.

In block 630, a signal at the cascoded node is coupled to the source of a common-gate amplifier via a phase shifting network.

In block 640, an auxiliary cascode current is generated using the common-gate amplifier.

In block 650, the common-gate amplifier is biased to cancel a distortion component in the principal cascode current.

In block 660, the auxiliary cascode current is combined with the principal cascode current to generate the cascode amplifier output current.

One of ordinary skill in the art will appreciate that while various exemplary embodiments have been described herein for single-ended amplifier configurations, the techniques disclosed may be applied also to fully differential amplifier configurations. Such exemplary embodiments are contemplated to be within the scope of the present disclosure.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. A method, comprising:
   accepting an input voltage;
   generating a principal cascode current based on the input voltage;
   coupling a signal at a cascoded node of the amplifier to the source of a common-gate amplifier via a phase shifting network;
   generating an auxiliary cascode current using the common-gate amplifier, wherein the auxiliary current increases in response to a decrease in a voltage at the cascoded node;
   biasing the common-gate amplifier to cancel a distortion component in the principal cascode current; and
   combining the auxiliary cascode current with the principal cascode current to generate an output current of the cascode amplifier.

2. The method of claim 1, the generating the auxiliary cascode current comprising:
   coupling the current generated by the common-gate amplifier to a secondary common-gate amplifier; the method further comprising:
   biasing the secondary common-gate amplifier to further cancel the distortion component in the principal cascode current.

3. The method of claim 1, the phase shifting network comprising a series capacitor and an inductor, the source of the common-gate amplifier coupled to the inductor.

4. The method of claim 1, further comprising coupling the cascode amplifier output current to a load, an output voltage of the cascode amplifier derived from the load.

5. The method of claim 1, the common-gate amplifier sized to cancel a distortion component in the principal cascode current.

6. A cascode amplifier, comprising:
   a first principal transistor and a second principal transistor coupled in a cascode configuration, the first and second principal transistors forming a principal cascode branch, the principal cascode branch having an output and a cascoded node;
   a phase shifting network coupled to the cascoded node; and
   a common-gate amplifier having an input coupled to the output of the phase shifting network, the output of the common-gate amplifier coupled to the output of the principal cascode branch;
   wherein the cascode amplifier is configured for increasing each of a current at the output of the common-gate amplifier and a current at the output of the principal cascode branch in response to an increase in an input voltage.

7. The apparatus of claim 6, further comprising:
   a second common-gate amplifier having an input coupled to the output of the common-gate amplifier, the output of the second common-gate amplifier coupled to the output of the principal cascode branch.

8. The apparatus of claim 6, the output of the principal cascode branch coupled to a load.

9. The apparatus of claim 6, the phase shifting network comprising a series capacitor and an inductor, the source of the common-gate amplifier coupled to the inductor.

10. The apparatus of claim 6, the common-gate amplifier sized to cancel a distortion component in the principal cascode current.

11. The apparatus of claim 7, the second common-gate amplifier sized to cancel a distortion component in the principal cascode current.

12. A cascode amplifier apparatus, comprising:
   means for generating a principal cascode current based on an input voltage;
   means for generating an auxiliary cascode current, the auxiliary cascode current coupled to the principal cascode current to generate an output current, wherein the auxiliary current increases in response to an increase in the principal cascade current; and
   means for coupling a signal at a cascoded node of the amplifier to the means for generating an auxiliary cascode current.

13. The apparatus of claim 12, the means for generating a principal cascode current comprising first and second principal transistors coupled in a cascode configuration.

14. The apparatus of claim 12, the means for coupling a signal at a cascoded node of the amplifier comprising a series capacitor and an inductor.

15. The apparatus of claim 12, the means for generating an auxiliary cascode current comprising at least one common-gate amplifier.

* * * * *